(12) United States Patent
Yan

(10) Patent No.: US 7,642,846 B2
(45) Date of Patent: Jan. 5, 2010

(54) APPARATUSES AND METHODS FOR PROVIDING OFFSET COMPENSATION FOR OPERATIONAL AMPLIFIER

(75) Inventor: Hai Yan, Fontana, CA (US)

(73) Assignee: Aptina Imaging Corporation (KY)

( * ) Notice: Subject to any disclaimer, the term of this patent is extended or adjusted under 35 U.S.C. 154(b) by 56 days.

(21) Appl. No.: 11/978,602

(22) Filed: Oct. 30, 2007

(65) Prior Publication Data

US 2009/0108929 A1 Apr. 30, 2009

(51) Int. Cl.
*H03F 1/02* (2006.01)
(52) U.S. Cl. .......................... 330/9; 330/253
(58) Field of Classification Search ............... 330/9; 327/124, 554
See application file for complete search history.

(56) References Cited

U.S. PATENT DOCUMENTS

| | | | |
|---|---|---|---|
| 5,124,663 | A | 6/1992 | McEntarfer et al. |
| 6,049,246 | A | 4/2000 | Kozisek et al. |
| 6,114,907 | A * | 9/2000 | Sakurai ............... 330/253 |
| 6,448,836 | B2 | 9/2002 | Kokubun et al. |
| 6,750,704 | B1 | 6/2004 | Connell et al. |
| 6,903,670 | B1 | 6/2005 | Lee et al. |
| 6,914,479 | B1 | 7/2005 | Gabillard et al. |
| 7,167,049 | B2 | 1/2007 | Lim |
| 7,276,962 | B1 * | 10/2007 | Tomasi ................. 330/9 |
| 7,295,071 | B1 * | 11/2007 | Lee ...................... 330/258 |
| 2002/0175731 | A1 | 11/2002 | Blon et al. |
| 2002/0175732 | A1 | 11/2002 | Blon et al. |
| 2003/0146786 | A1 | 8/2003 | Gulati et al. |
| 2004/0210801 | A1 | 10/2004 | Prasad et al. |
| 2004/0222844 | A1 | 11/2004 | Doorenbos et al. |
| 2005/0116769 | A1 | 6/2005 | Tei et al. |
| 2005/0134307 | A1 | 6/2005 | Stojanovic et al. |
| 2005/0174174 | A1 | 8/2005 | Lim |
| 2005/0285678 | A1 | 12/2005 | Kaviani et al. |

(Continued)

FOREIGN PATENT DOCUMENTS

JP 11-150454 6/1999

(Continued)

OTHER PUBLICATIONS

"Zero-Drift, Single-Supply, Rail-to-Rail Input/Output Operational Amplifiers", AD8551/AD8552/AD8554, Analog Devices 2002, (20 pages).
Ming-Huang Liu et al., "An 8-bit 10 MS/s Folding and Interpolating ADC Using the Continuous-Time Auto-Zero Technique", IEEE Journal of Solid-State Circuits, vol. 36, No. 1, Jan. 2001, pp. 122-128.

(Continued)

*Primary Examiner*—Robert Pascal
*Assistant Examiner*—Khiem D Nguyen
(74) *Attorney, Agent, or Firm*—Dickstein Shapiro LLP

(57) ABSTRACT

Apparatuses and methods for providing offset compensation include a primary amplifier which includes a first output, a second output, a first load input, and a second load input, a first feedback loop connected to the primary amplifier and which includes a first switch located between the first output of the primary amplifier and the first load input, and a first sampling capacitor coupled to the first switch between the first switch and the first load input and a second feedback loop connected to the primary amplifier and which includes a second switch located between the second output of the primary amplifier and the second load input, and a second sampling capacitor coupled to the second switch between the second switch and the second load input.

19 Claims, 12 Drawing Sheets

U.S. PATENT DOCUMENTS

| | | |
|---|---|---|
| 2006/0086891 A1 | 4/2006 | Gottesman et al. |
| 2006/0125543 A1 | 6/2006 | Hsieh et al. |
| 2006/0244521 A1 | 11/2006 | Yoshida et al. |
| 2007/0052564 A1 | 3/2007 | Funakoshi et al. |
| 2007/0139116 A1 | 6/2007 | Yang et al. |

FOREIGN PATENT DOCUMENTS

| | | |
|---|---|---|
| JP | 2005-020291 | 1/2005 |
| TW | 253230 | 4/2006 |
| WO | WO 02/087073 | 10/2002 |
| WO | WO 2007/028001 | 3/2007 |

OTHER PUBLICATIONS

Behzad Razavi, "Design Techniques for High-Speed, High-Resolution Comparators," IEEE Journal of Solid-State Circuits, vol. 27, No. 12, Dec. 1992, pp. 1916-1926.

Kenneth C. Dyer, et al., "An Analog Background Calibration Technique for Time-Interleaved Analog-to-Digital Converters," IEEE Journal of Solid-State Circuits, vol. 33, No. 12, Dec. 1998, pp. 1912-1919.

Jaime Ramirez-Angulo, et al., "Very Low-Voltage Analog Signal Processing Based on Quasi-Floating Gate Transistors," IEEE Journal of Solid-State Circuits, vol. 39, No. 3, Mar. 2004, pp. 434-442.

* cited by examiner

APPARATUSES AND METHODS FOR PROVIDING OFFSET COMPENSATION FOR OPERATIONAL AMPLIFIER

FIELD OF THE INVENTION

Disclosed embodiments relate generally to the field of providing offset compensation for an operational amplifier to minimize the offset voltage in the readout chain of an imaging device.

BACKGROUND OF THE INVENTION

FIG. 1 illustrates an imaging device 100 having a CMOS pixel array 140. Row lines of the array 140 are selectively activated by a row driver 145 in response to row address decoder 155. A column driver 160 and column address decoder 170 are also included in the imaging device 100. The imaging device 100 is operated by the timing and control circuit 150, which controls the address decoders 155, 170. The control circuit 150 also controls the row and column driver circuitry 145, 160.

The following devices form the readout chain of the imaging sensor 100. A sample and hold circuit 161 associated with the column driver 160 samples and holds a pixel reset signal Vrst and a pixel image signal Vsig for each selected pixel of the array 140. A differential signal (Vrst−Vsig) is produced by a differential amplifier 162 for each pixel and is digitized by analog-to-digital converter 175 (ADC). The analog-to-digital converter 175 supplies the digitized pixel signals to an image processor 180, which forms and may output a digital image.

The output of an imaging device 100 is very sensitive to operational amplifier ("opamp") offset voltage. The offset voltage is the voltage required across the input terminals of the operational amplifier to drive the output voltage to zero. In an ideal operation amplifier, there would be no offset voltage required. However, offset voltage is required in real-world operational amplifiers because of internal imperfections. Some industry techniques have been developed to reduce the offset voltage together with noise (which has similar characteristics as offset voltage at low frequencies). These techniques, described below, include chopper stabilization, auto-zero, and correlated double sampling (CDS). In the chopper stabilization technique, the input signal is modulated with a high frequency carrier before amplification and is then demodulated after amplification to obtain an amplified version of the input signal. The offset voltage is modulated only once in the path and is filtered out with a subsequent low-pass filter. The main drawbacks of chopper stabilization are that it is bandwidth limited to half of the chopper frequency to avoid signal aliasing, and that it requires filtering to remove the large ripple voltages generated by chopping.

FIG. 2 is a schematic diagram of a conventional auto-zero amplifier 200. Amplifier 200 includes a primary amplifier $A_B$, an auxiliary amplifier $A_A$, two auto-zero phase switches 201, 202, controlled by an auto-zero phase signal $\Phi_A$, for use during an auto-zero phase, and two amplification phase switches 203, 204, controlled by an amplification phase signal $\Phi_B$, for use during an amplification phase. Amplifier 200 further includes biasing capacitors $V_{OSA}$, $C_{M1}$, $C_{M2}$. The primary amplifier $A_B$ includes a non-inverting input 210, an inverting input 220, an offset nulling port $B_B$, and an output 250. The auxiliary amplifier $A_A$ includes a non-inverting input 230, an inverting input 240, an offset nulling port $-B_A$, and an output 260.

As shown in FIG. 2, during the auto-zero phase, the auxiliary amplifier $A_A$ is configured in unity gain feedback (i.e., the output tracks the input without amplification) between the output port 260 and the offset nulling port $-B_A$, while inputs of the auxiliary amplifier $A_A$ are shorted by closing the auto-zero phase switches 201, 202 and opening the amplification phase switches 203, 204. The biasing condition of the nulling port $-B_A$ is sampled in the auto-zero phase and held throughout the subsequent amplification phase, when the amplification phase switches 203, 204 are closed and the auto-zero phase switches 201, 202 are open. This results in an almost offset voltage-free auxiliary amplifier $A_A$ in the amplification phase.

In the amplification phase, the signal path $V_{OA}$ has significantly more gain (primary amplifier $A_B$ gain times auxiliary amplifier $A_A$ gain) than the offset path $V_{NA}$ (primary amplifier $A_B$ gain). Thus, the equivalent input offset voltage of the amplifier 200 is greatly reduced by the gain ratio of the two paths $V_{OA}$, $V_{NA}$. Drawbacks of this conventional design are that it requires two amplifiers $A_A$, $A_B$ and it often has a larger layout area than other amplifier designs.

FIG. 3 is a schematic diagram of a conventional amplifier 300 with offset compensation for auto-zeroing. Amplifier 300 includes a distributed amplifier 310, an offset compensation block 320, and a two-stage amplifier 330. The distributed amplifier includes first and second transistors m1, m2, first and second resistance circuits $R_1$, $R_2$, a first biasing transistor Bias, an input terminal IN, a reference voltage input REF, and a switch 311 controlled by an auto-zero signal AZ for connecting the input terminal IN to the reference voltage input REF. The offset compensation block 320 includes third and fourth transistors m3, m4, a second biasing transistor B, two capacitors C1, C2, and two switches 321, 322 controlled by the auto-zero signal AZ. Two-stage amplifier 330 includes first and second amplifiers $A_1$, $A_2$, where the second amplifier $A_2$ outputs to two switches 331, 332, each controlled by an inverse auto-zero signal/AZ. The first amplifier $A_1$ inputs signals from the distributed amplifier 310 via a pair of capacitors 327, 328, each connected to a respective switch 325, 326, respectively connected to the first and second transistors m1, m2. Switches 331, 332 receive signals from the offset compensation block 320 via switches 321, 322.

This configuration implements offset cancellation using the same principle as the auto-zero phase of the auxiliary amplifier $A_A$ presented in FIG. 2. A drawback of this design is that the phase margin of the signal path will be jeopardized due to the additional offset compensation block 320 before the traditional two-stage amplifier 330. In addition, more noise may be introduced due to additional CMOS elements in the offset compensation block.

Correlated double sampling (CDS) is another approach to reduce the offset voltage and noise. Correlated double sampling typically involves two steps of sampling. The first step samples the offset voltage and stores the sampled offset voltage in a capacitor. The second step samples both the offset voltage and the signal and performs a difference operation with the offset voltage sampled in the first step. The offset voltage is thus ideally cancelled out by correlated double sampling.

FIG. 4 is a schematic diagram of a conventional circuit 400 for implementing correlated double sampling. Circuit 400 includes an ideal operational amplifier 410, having two inputs 411, 412 and an output 413. An offset voltage source Vos is connected in series with input 411. Circuit 400 further includes three switches 415, 420, 425. Switches 420, 425 are controlled by a first phase signal phi1, and switch 415 is controlled by a second phase signal phi2.

In a first phase, the first phase signal phi1 is asserted, closing switches 420 and 425, and the operational amplifier 410 is configured in unity gain feedback, such that the output tracks the input without amplification. An offset voltage is sampled and stored in an offset capacitor Cos. In a second phase, the second phase signal phi2 is asserted, closing switch 415, and the voltage stored in offset capacitor Cos is used to cancel the offset voltage of the operational amplifier 410. This implementation has a disadvantage in that the operational amplifier 410 is required to be unity-gain stable, which is usually difficult and unnecessary in certain cases. In addition, due to the input parasitic capacitance of the operational amplifier, the feedback factor is usually degraded undesirably.

FIG. 5 is a circuit diagram of a conventional differential telescopic operational amplifier 500. Amplifier 500 includes first through tenth transistors 505, 510, 515, 520, 525, 530, 535, 540, 545, 550. First through fourth transistors 505, 510, 515, 520 are p-type transistors. Fifth through tenth transistors 525, 530, 535, 540, 545, 550 are n-type transistors. Transistors 505, 515, 525, 535, 545 are connected in series, and transistors 510, 520, 530, 540, 550 are connected in series.

Transistors 505, 510 have their gates connected to each other and to a first line 555, which is connected to a first bias output BIASP. Transistors 515, 520 have their gates connected to each other and to a second line 560, which is connected to biasing circuitry (not shown). Transistors 525, 530 have their gates connected to each other and to a third line 565, which is connected to biasing circuitry (not shown). A first signal output OUTN is located between transistors 515, 525. A second signal output OUTP is located between transistors 520, 530. Transistors 535, 540 receive first and second signal inputs INP, INN at their respective gates. A third line 570 is connected between transistors 535, 545, and between transistors 540, 550, and is connected to biasing circuitry (not shown). A fourth line 575 is connected to biasing circuitry (not shown), and to a gate of the ninth transistor 545, and to a second bias output BIASN. A common mode feedback input CMFB is connected to a gate of the tenth transistor 550 for receiving a common mode feedback based on the outputs OUTP, OUTN. Amplifier 500 has a disadvantage in that the biases of the first and second transistors 505, 510 are fixed and reliant on each other.

Accordingly, there is a need and desire for a method and apparatus for providing offset compensation for an operational amplifier to minimize the offset voltage in a readout chain of an imaging device.

DETAILED DESCRIPTION OF THE INVENTION

In the following detailed description, reference is made to the accompanying drawings, which form a part hereof and show by way of illustration specific embodiments that may be practiced. These embodiments are described in sufficient detail to enable those skilled in the art to practice them, and it is to be understood that other embodiments may be utilized, and that structural, logical, processing, and electrical changes may be made. The progression of processing steps described is an example; however, the sequence of steps is not limited to that set forth herein and may be changed as is known in the art, with the exception of steps necessarily occurring in a certain order.

Accordingly, the following detailed description is not to be taken in a limiting sense, and the described embodiments are defined only by the appended claims.

Figure 5:
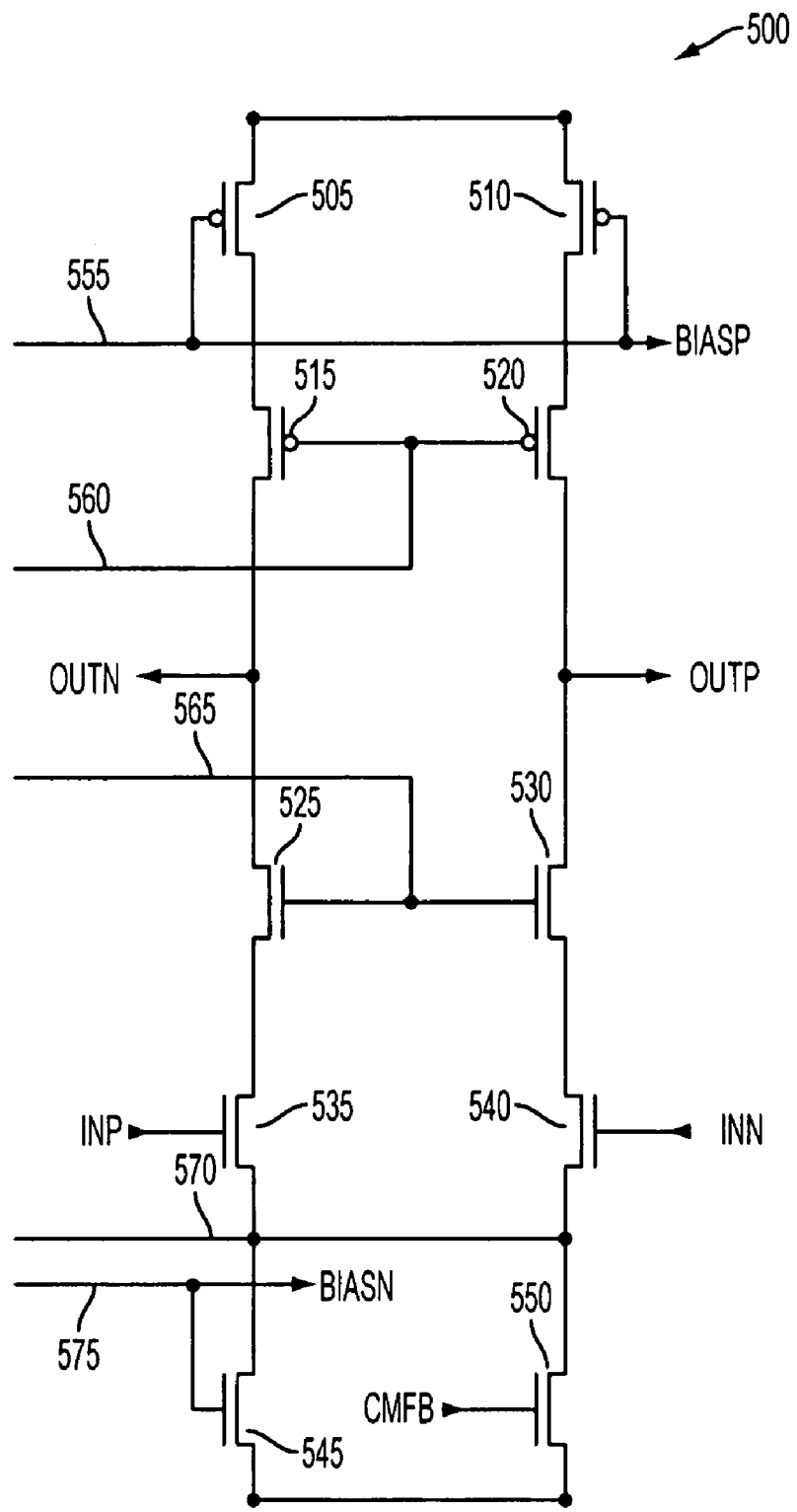
FIG. 5 is a circuit diagram of a conventional differential telescopic operational amplifier.
Figure 6:
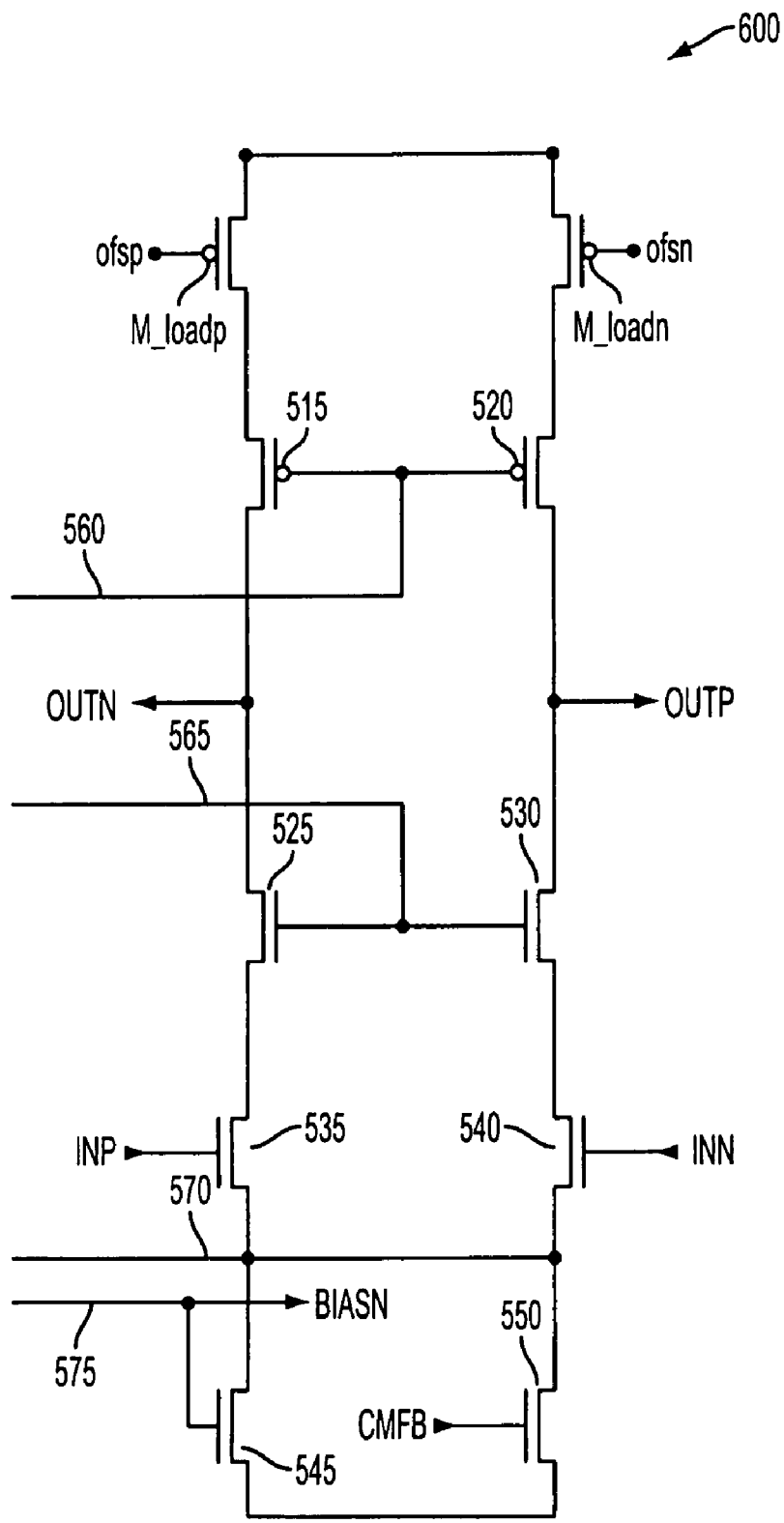
FIG. 6 is a circuit diagram of a differential telescopic operational amplifier constructed in accordance with an embodiment described herein.

FIG. 6 is a circuit diagram of a differential telescopic operational amplifier 600 constructed in accordance with an embodiment described herein. The operational amplifier 600 is similar to the operational amplifier 500 of FIG. 5, except that the first and second transistors 505, 510 of FIG. 5 are replaced with two load transistors M_loadp, M_loadn having gates respectively dynamically biased by load lines ofsp, ofsn, and the FIG. 5 first line 555 and first bias output BIASP of amplifier 500 have been eliminated.

Figure 7:
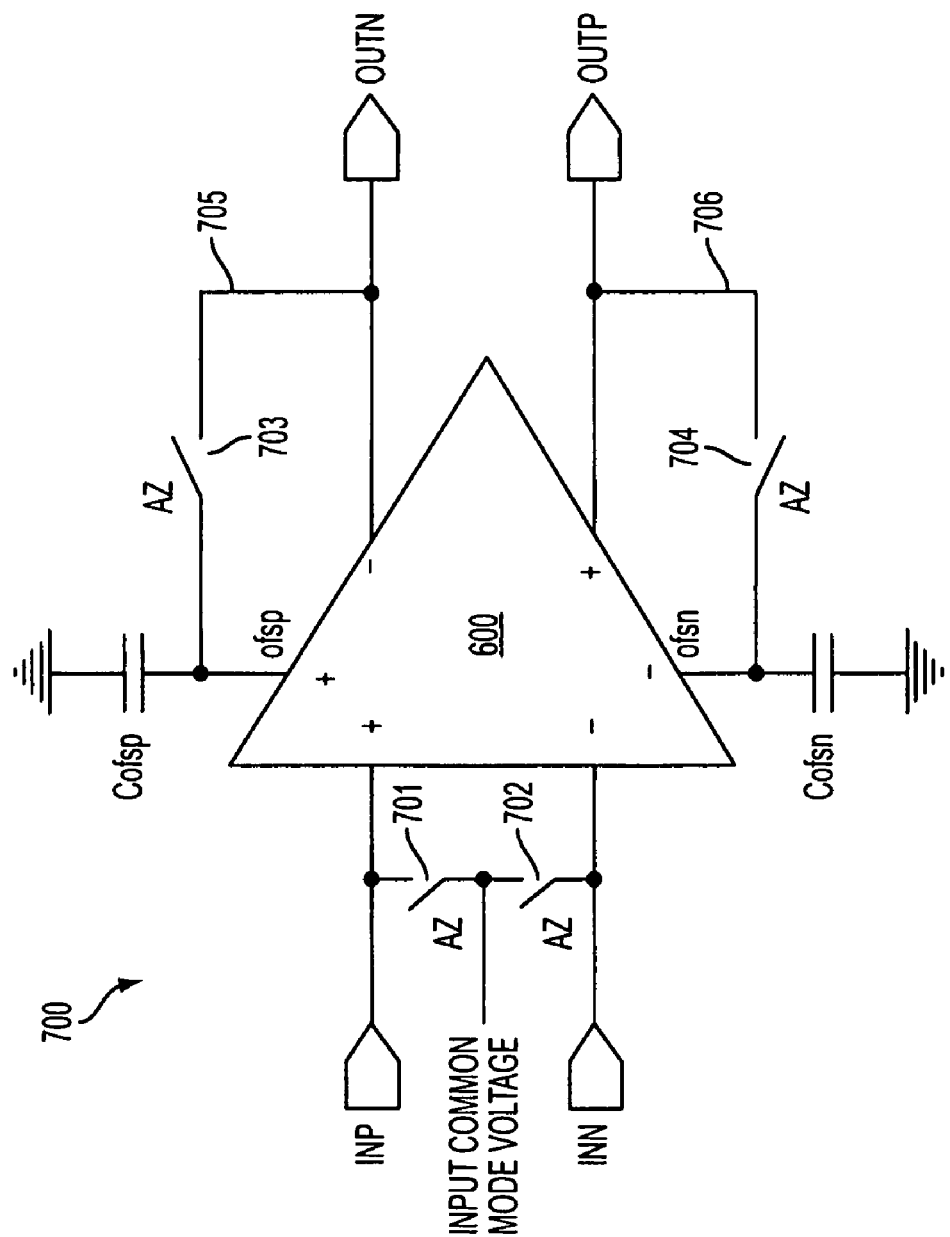
FIG. 7 is a schematic diagram of a circuit for offset cancellation constructed in accordance with an embodiment described herein.

FIG. 7 is a schematic diagram of a circuit 700, constructed in accordance with an embodiment described herein, for offset cancellation using amplifier 600 and dynamically biasing the operational amplifier 600. Circuit 700 includes the amplifier 600 of FIG. 6, and first through fourth switches 701-704 controlled by an auto-zero signal AZ. A method of operating the circuit 700 is described below. Referring to FIGS. 6 and 7, in an auto-zero phase, the differential outputs OUTP, OUTN of the operational amplifier 600 are connected to gates of the two load transistors M_loadp, M_loadn via the load lines ofsp and ofsn, while the inputs INP, INN of the operational amplifier 600 are shorted to the input common mode voltage. Switches 703, 704 are included in respective feedback loops 705, 706 which connect the load transistors' inputs ofsp, ofsn to the differential outputs OUTP, OUTN.

Differential offset voltages appearing at the outputs OUTP, OUTN of the operational amplifier 600 are sampled in two offset capacitors Cofsp, Cofsn connected to the gates of the two load transistors M_loadp, M_loadn during the auto-zero phase and are held throughout a subsequent amplifying phase. After the auto-zero phase, the input offset voltages can be expressed as OUTP/A and OUTN/A, where A is the DC gain of the operational amplifier 600. This value is typically very small, thus the operational amplifier 600 can be treated as an almost offset-free (i.e., ideal) operational amplifier. Moreover, low frequency noise is reduced. The auto-zero phase may be repeated to provide dynamic offset cancellation because the outputs are re-sampled and the offset similarly canceled as noise or other conditions change over time.

When the operational amplifier 600 is used in an image sensor with an electronic rolling shutter, the auto-zero period can overlap or partially overlap with a row sampling time. This gives a long enough period of time for the auto-zero phase. The auto-zero procedure repeats in every row operation before pixel amplification starts. After the auto-zero procedure is done, the operational amplifier 600 can be used as an almost offset-free operational amplifier to read out the signals stored in columns of the whole row. Meanwhile, row-wise noise can also be reduced due to the reduction of noise from the operational amplifier 600.

Figure 8:
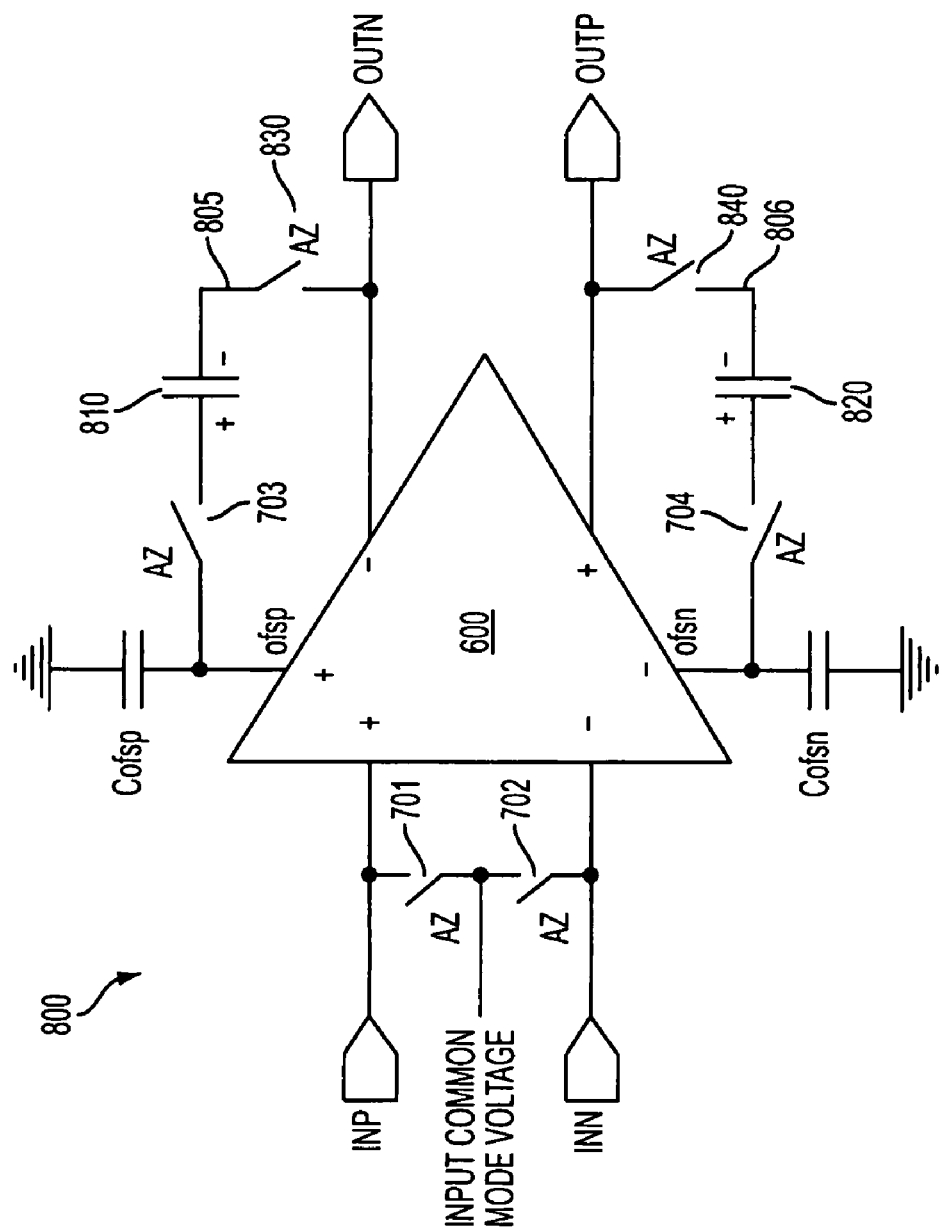
FIG. 8 is a schematic diagram of a circuit for offset cancellation constructed in accordance with an embodiment described herein.
Figure 9:
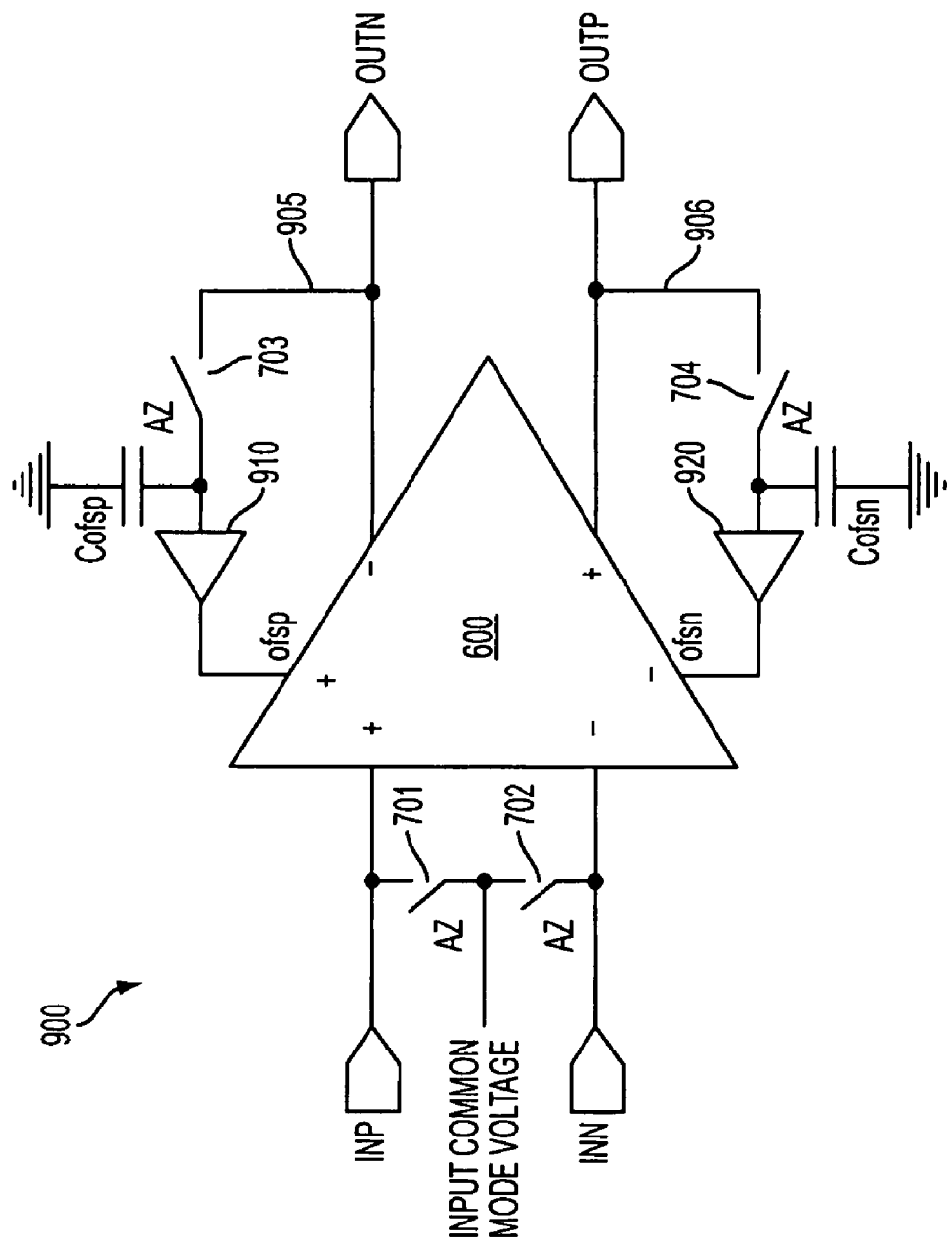
FIG. 9 is a schematic diagram of a circuit for offset cancellation constructed in accordance with an embodiment described herein.
Figure 10:
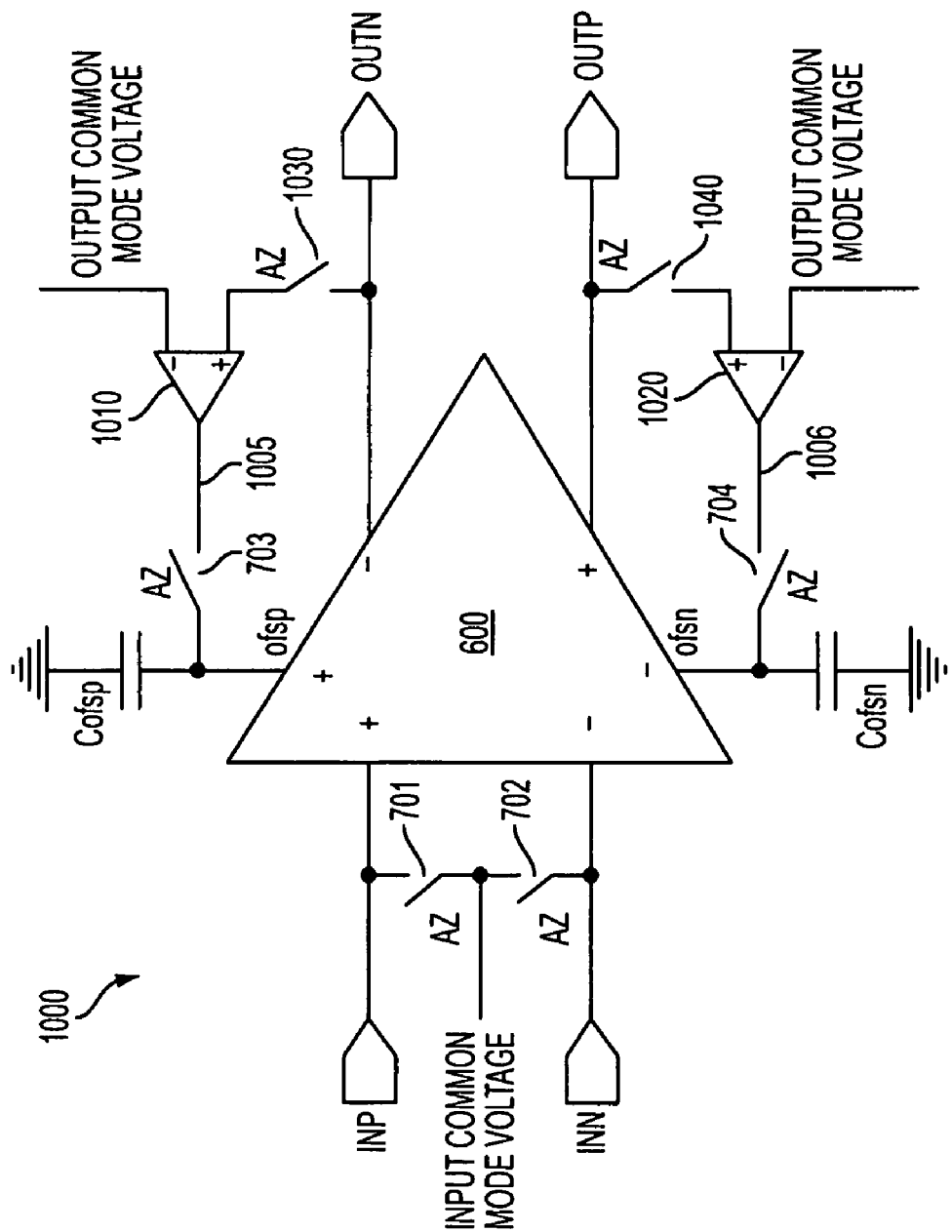
FIG. 10 is a schematic diagram of a circuit for offset cancellation constructed in accordance with an embodiment described herein.

Alternative offset cancellation schemes are shown in FIGS. 8-10. FIG. 8 is a schematic diagram of a circuit 800 for offset cancellation constructed in accordance with an embodiment described herein. The circuit 800 of FIG. 8 is similar to the circuit 700 of FIG. 7, except that two pre-charged capacitors 810, 820 with respective switches 830, 840 (controlled by the auto-zero signal AZ) are inserted in the offset voltage feedback loops 805, 806 to set the output common mode voltage OUTP, OUTN to, or close to, a predetermined value. The switches 830, 840 can be made small to prevent charge leakage of the offset capacitors Cofp, Cofn since the auto-zero phase may be much longer than a clock period. The pre-charged capacitors 810, 820 are charged by applying a voltage across their respective terminals.

FIG. 9 is a schematic diagram of a circuit 900 for offset cancellation constructed in accordance with another embodiment described herein. The circuit 900 of FIG. 9 is similar to the circuit 700 of FIG. 7, except that two buffers 910, 920 are inserted in the offset voltage feedback loops 905, 906 and the offset voltage sampling capacitors Cofsp, Cofsn are placed at the input of the buffers 910, 920. The buffers 910, 920 help prevent the operational amplifier output signals OUTP, OUTN from disturbing the biasing voltages sampled and held on the offset voltage sampling capacitors Cofsp, Cofsn for offset cancellation, especially in the case that multiple amplifying phases follow one single auto-zero phase (as when circuit 800 is used in a CMOS imaging sensor).

FIG. 10 is a schematic diagram of a circuit 1000 for offset cancellation constructed in accordance with another embodiment described herein. The circuit 1000 of FIG. 10 is similar to the circuit 700 of FIG. 7, except that two assistant operational amplifiers 1010, 1020 each having differential inputs are inserted in the offset voltage feedback loops 1005, 1006 so that an output common mode voltage can be set to a predetermined value. The assistant operational amplifiers 1010, 1020 have respective switches 1030, 1040 (controlled by the auto-zero signal AZ) connected to the non-inverting inputs, and each receive the output common mode voltage at an inverting input.

Figure 11:
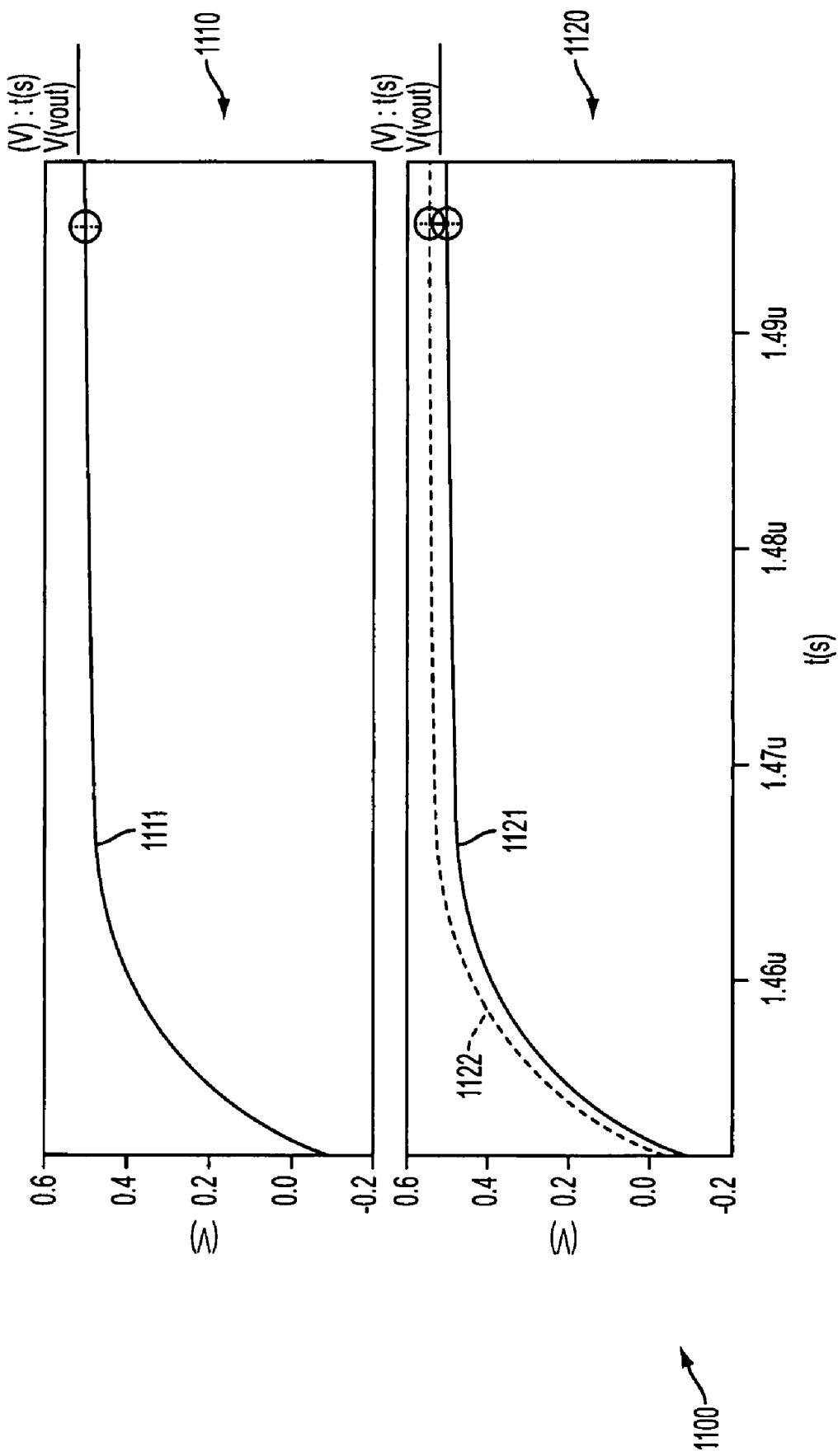
FIG. 11 is a graph of charts of two simulation test results.

FIG. 11 is a graph 1100 of two charts 1110, 1120 of two simulation test results. Both charts 1110, 1120 simulate a 0 V and a 10 mV operational amplifier offset voltage, showing voltage with respect to time. Chart 1110 shows a result of a simulation using the operational amplifier 600 described in FIG. 6 and the circuit 700 described in FIG. 7. Chart 1120 shows a result of a simulation using the conventional operational amplifier 500 described in FIG. 5. For the charge amplifier using the operational amplifier 600, the simulations show almost no difference (<1 uV difference) between the two situations (i.e., with a 0 V or a 10 mV operational amplifier offset voltage), such that only one line 1111 is visible, representing two overlapping lines.

However, for the charge amplifier using the conventional telescopic operational amplifier 500, a 10 mV operational amplifier offset voltage causes about 49.8 mV difference between the two situations (i.e., with a 0 V or a 10 mV operational amplifier offset voltage), where the 0 V offset result is shown the solid line 1121, and the 10 V offset result is shown the dashed line 1122. The difference of 49.8 mV, which approximately equals the operational amplifier offset voltage divided by a feedback factor, is the expected result for the conventional amplifier 500. The simulation results verify the effectiveness of offset voltage cancellation for the amplifier 500.

Figure 1:
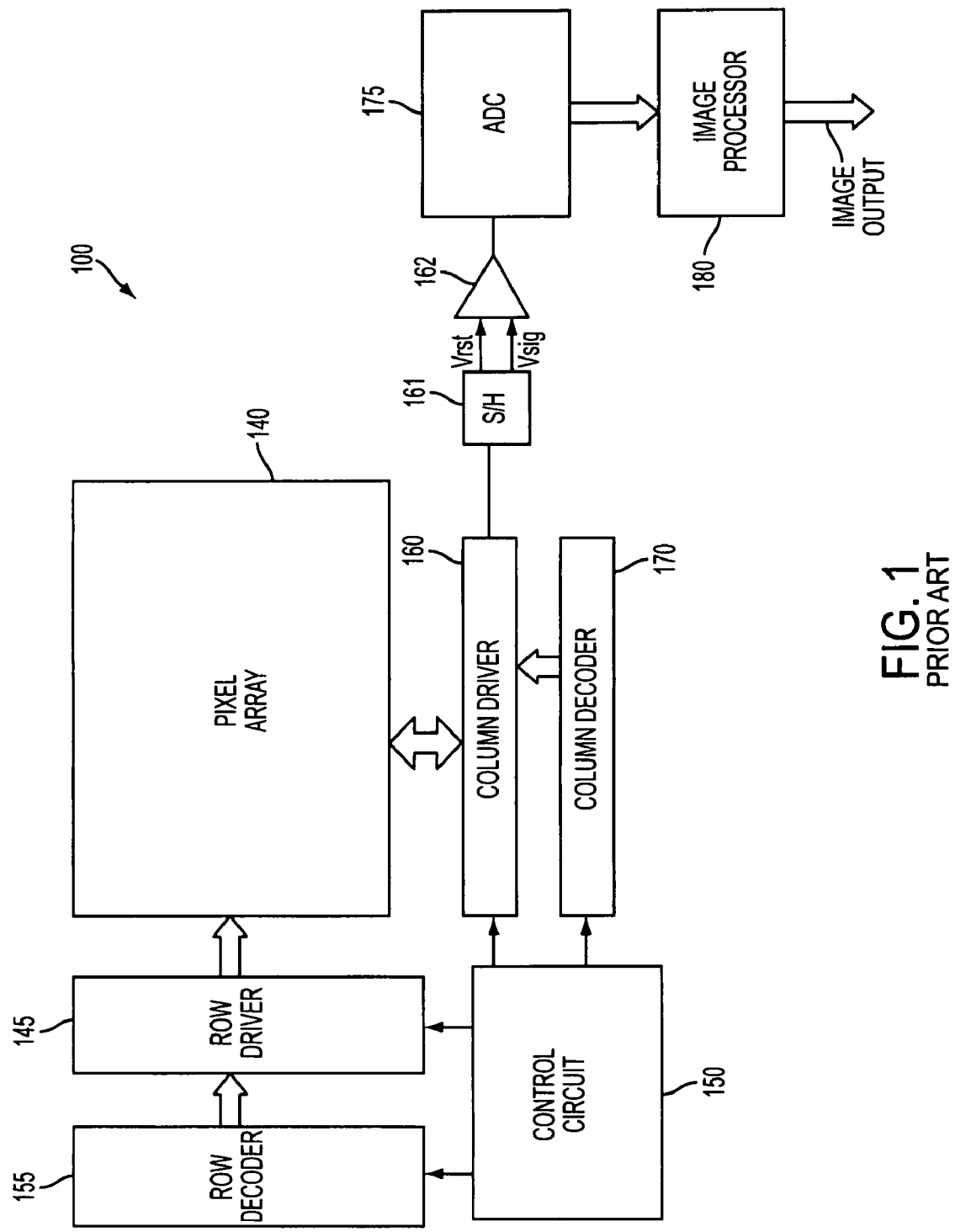
FIG. 1 illustrates a block diagram of a conventional imaging device.
Figure 2:
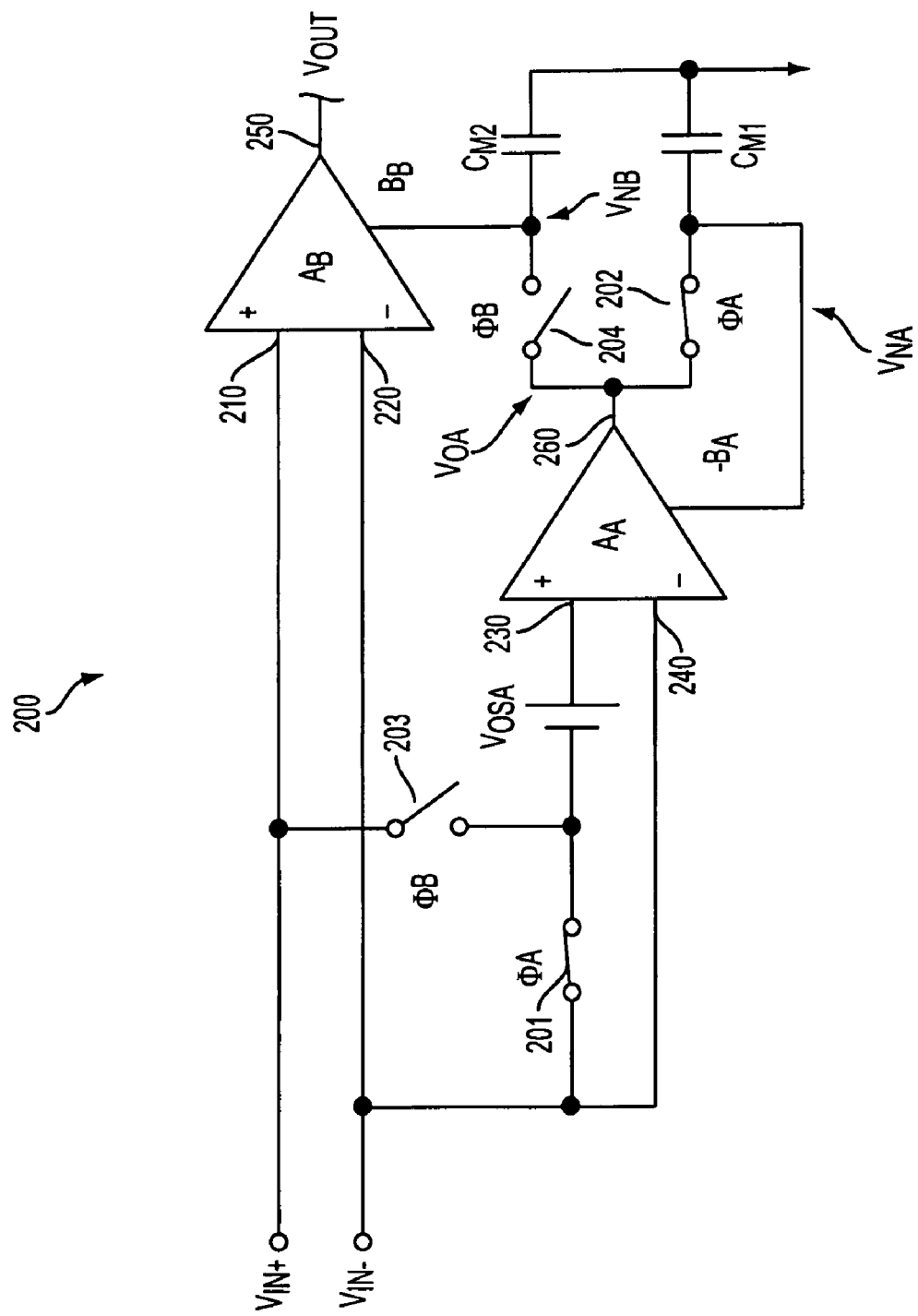
FIG. 2 is a schematic diagram of a conventional auto-zero amplifier.
Figure 3:
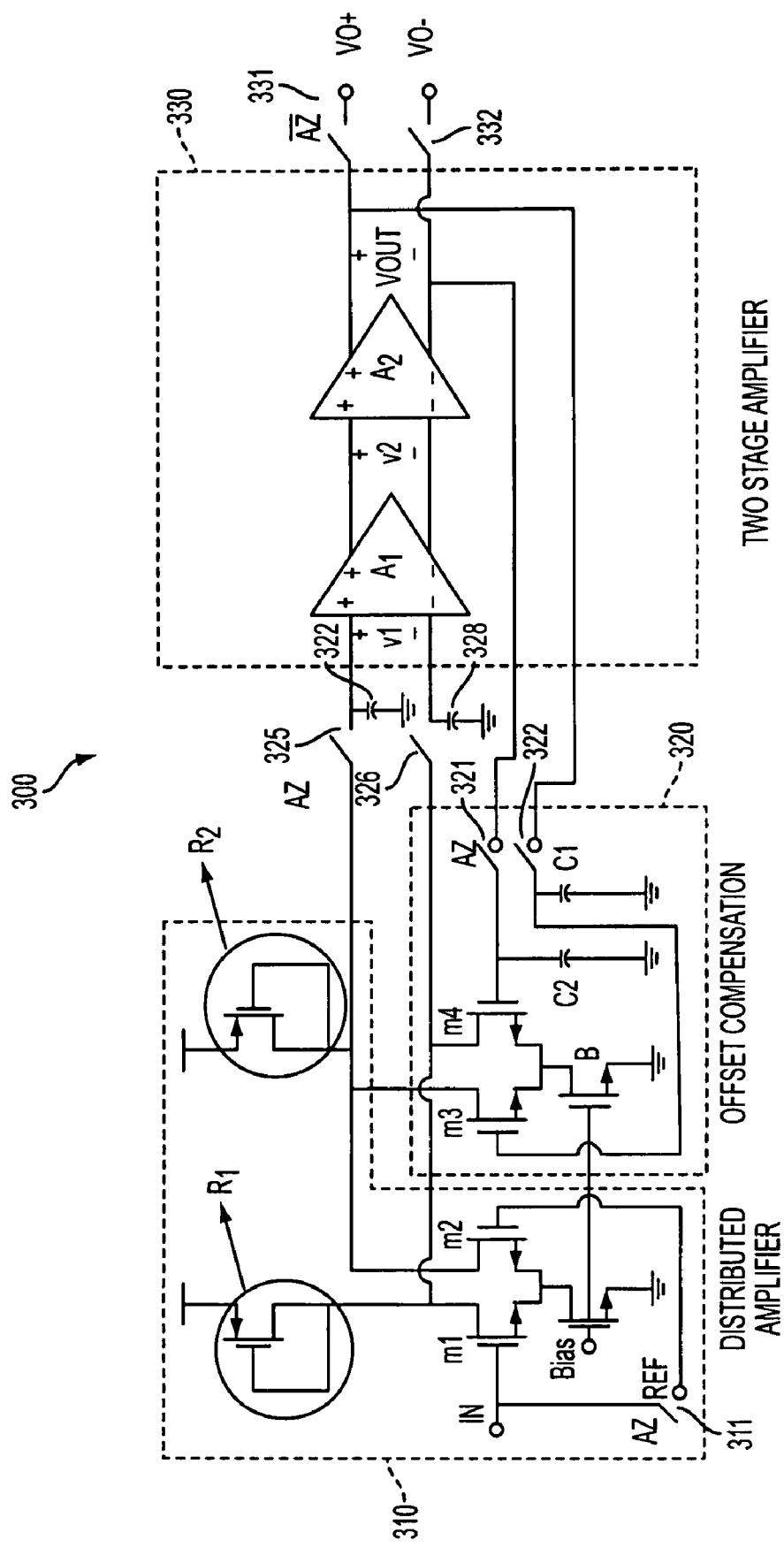
FIG. 3 is a schematic diagram of a conventional amplifier with offset compensation for auto-zeroing.
Figure 4:
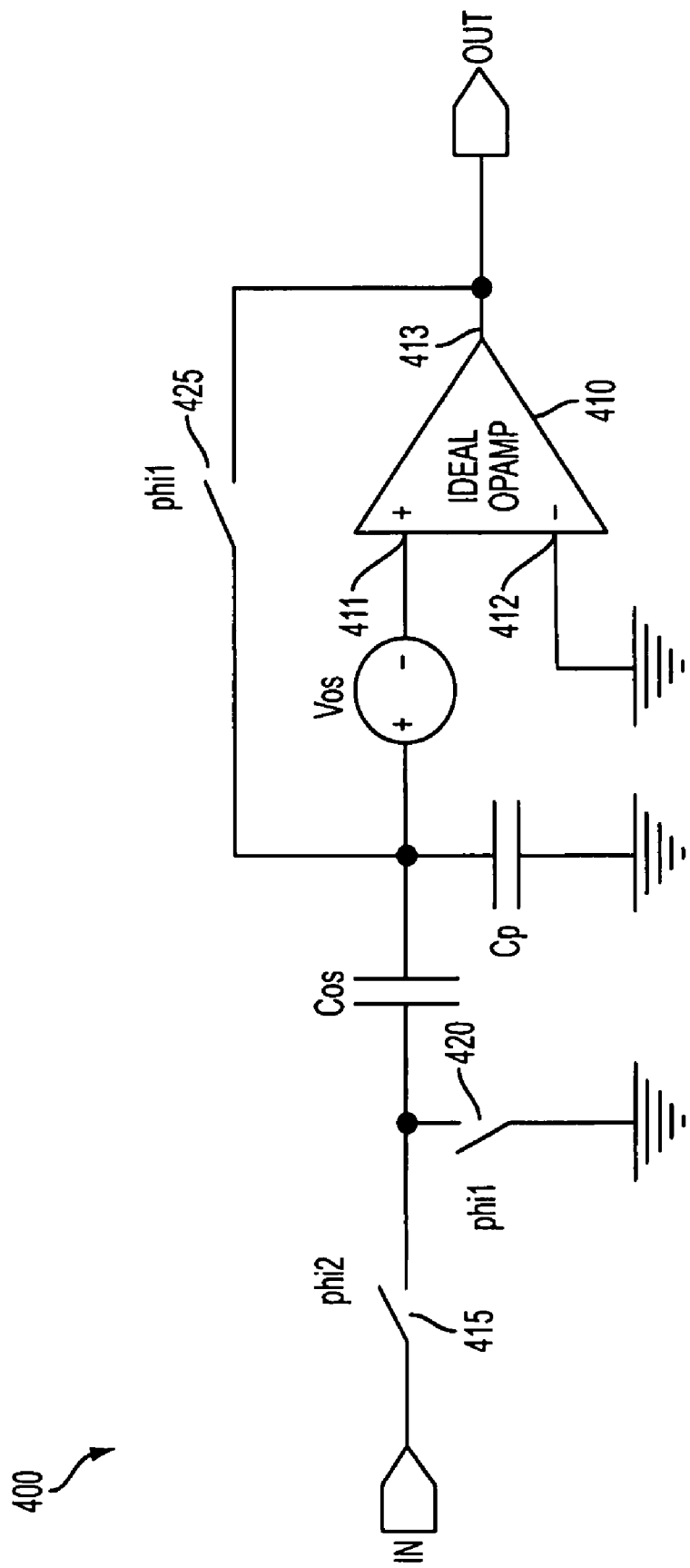
FIG. 4 is a schematic diagram of a conventional circuit for implementing correlated double sampling.
Figure 12:
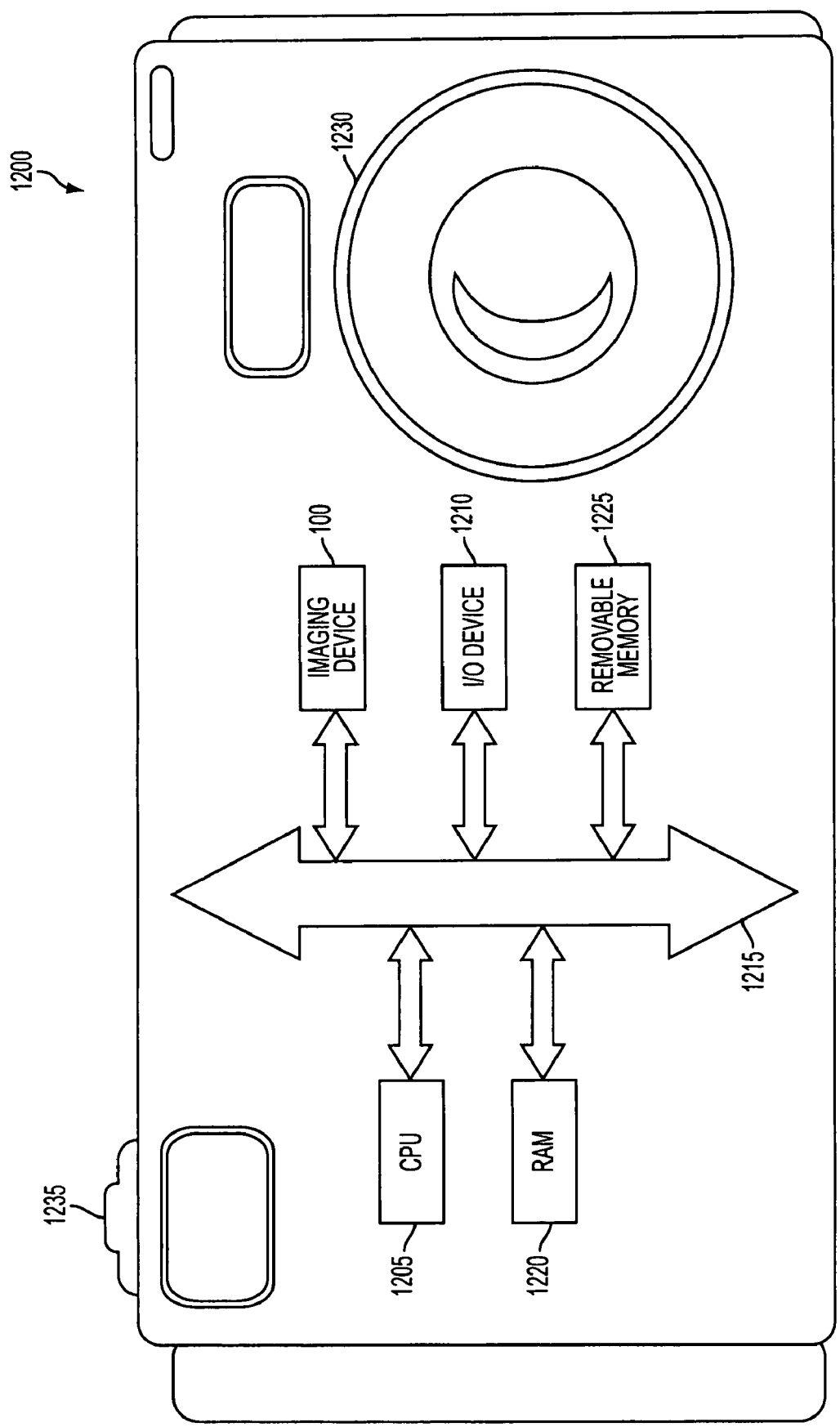
FIG. 12 is an embodiment of a camera system that can be used an imaging device constructed in accordance with an embodiment described herein.

FIG. 12 is an embodiment of a camera system 1200, which can use an imaging device constructed in accordance with an embodiment described herein, such as imaging device 100 (FIG. 1) using the differential telescopic operational amplifier 600 in place of the differential amplifier 162. The amplifier 600 may be used in camera system 1200 with any of the circuits 700, 800, 900, 1000 to provide offset cancellation for the amplifier 600. Camera system 1200, for example, is a still or video camera system, which generally comprises a lens 1230 for focusing an image on the pixel array 140 (FIG. 1) when shutter release button 1235 is depressed, a central processing unit (CPU) 1205, such as a microprocessor for controlling camera operations, that communicates with one or more input/output (I/O) devices 1210 over a bus 1215. Imaging device 100 also communicates with the CPU 1205 over bus 1215. The system 1200 also includes random access memory (RAM) 1220, and can include removable memory 1225, such as flash memory, which also communicate with CPU 1205 over the bus 1215. Imaging device 100 may be combined with a processor, such as a CPU, digital signal processor, or microprocessor, with or without memory storage on a single integrated circuit or on a different chip than the processor.

The camera system 1200 is one example of a system having digital circuits that could include image sensor devices. Without being limiting, such a system could instead include a computer system, scanner, machine vision, vehicle navigation, video phone, surveillance system, auto focus system, star tracker system, motion detection system, image stabilization system, and other image acquisition and processing system.

The processes and devices in the above description and drawings illustrate examples of methods and devices of many that could be used and produced to achieve the features, and advantages of embodiments described herein. For example, embodiments include combining amplifier 500 with any of circuits 700, 800, 900, 1000. In addition, the amplifier 600 is not limited to the specific p-type and n-type transistors shown in FIG. 6. In addition, embodiments are not limited to using a CMOS imaging device. Thus, the embodiments are not to be seen as limited by the foregoing description of the embodiments, but only limited by the appended claims.

The invention claimed is:

1. A circuit for providing offset cancellation comprising:
 a primary amplifier comprising:
  a first output;
  a second output;
  a first load input; and
  a second load input;
 a first feedback loop connected to the primary amplifier, the first feedback loop comprising:
  a first switch located between the first output of the primary amplifier and the first load input; and
  a first offset capacitor, a first plate of the first offset capacitor being coupled to the first switch between the first switch and the first load input, and a second plate of the first offset capacitor being coupled to ground; and a second feedback loop connected to the primary amplifier, the second feedback loop comprising:
   a second switch located between the second output of the primary amplifier and the second load input; and
   a second offset capacitor, a first plate of the second offset capacitor being coupled to the second switch between the second switch and the second load input, and a second plate of the second offset capacitor being coupled to ground.

2. The circuit of claim 1, further comprising:
a third switch for switchably connecting a first input of the primary amplifier to an input common mode voltage; and
a fourth switch for switchably connecting a second input of the primary amplifier, the input common mode voltage, and the third switch.

3. The circuit of claim 1, further comprising:
a first pre-charged capacitor coupled to the first switch;
a third switch connected to the first pre-charged capacitor and to the first output;
a second pre-charged capacitor coupled to the second switch; and
a fourth switch connected to the second pre-charged capacitor and to the second output.

4. The circuit of claim 1, further comprising:
a first buffer having an input connected to the first offset capacitor and an output connected to the first load input of the primary amplifier; and
a second buffer having an input connected to the second offset capacitor and an output connected to the second load input of the primary amplifier.

5. The circuit of claim 1, further comprising:
a first assistant operational amplifier comprising an output coupled to the first switch, a first input coupled to an output common mode voltage, and a second input switchably connected to the first output of the primary amplifier; and
a second assistant operational amplifier comprising an output coupled to the second switch, a first input coupled to the output common mode voltage, and a second input switchably connected to the second output of the primary amplifier.

6. An imaging device comprising:
a first amplifier comprising:
   a non-inverting output;
   an inverting output;
   a first load input; and
   a second load input;
a first feedback loop connected to the first amplifier, the first feedback loop comprising:
   a first switch located between the inverting output of the first amplifier and the first load input; and
   a first offset capacitor, a first plate of the first offset capacitor being coupled to the first switch between the first switch and the first load input; and a second plate of the first offset capacitor being coupled to ground; and
a second feedback loop connected to the first amplifier, the second feedback loop comprising:
   a second switch located between the inverting output of the first amplifier and the second load input; and
   a second offset capacitor, a first plate of the second offset capacitor being coupled to the second switch between the second switch and the second load input, and a second plate of the second offset capacitor being coupled to ground.

7. The imaging device of claim 6, further comprising:
a third switch for switchably connecting a non-inverting input of the first amplifier to an input common mode voltage; and
a fourth switch for switchably connecting an inverting input of the first amplifier, the input common mode voltage, and the third switch.

8. The imaging device of claim 6, further comprising:
a first pre-charged capacitor coupled to the first switch;
a third switch connected to the first pre-charged capacitor and to the inverting output;
a second pre-charged capacitor coupled to the second switch; and
a fourth switch connected to the second pre-charged capacitor and to the non-inverting output.

9. The imaging device of claim 6, further comprising:
a first buffer having an input connected to the first offset capacitor and an output connected to the first load input of the first amplifier; and
a second buffer having an input connected to the second offset capacitor and an output connected to the second load input of the first amplifier.

10. The imaging device of claim 6, further comprising:
a second amplifier comprising an output coupled to the first switch, a first input coupled to an output common mode voltage, and a second input switchably connected to the inverting output of the first amplifier; and
a third amplifier comprising an output coupled to the second switch, a first input coupled to the output common mode voltage, and a second input switchably connected to the non-inverting output of the first amplifier.

11. A camera system comprising:
a differential telescopic operational amplifier comprising:
   a first output;
   a second output;
   a first load input; and
   a second load input;
a first feedback loop connected to the differential telescopic operational amplifier, the first feedback loop comprising:
   a first switch located between the first output of the differential telescopic operational amplifier and the first load input; and
   a first offset capacitor, a first plate of the offset capacitor being coupled to the first switch between the first switch and the first load input, and a second plate of the first offset capacitor being coupled to ground;
a second feedback loop connected to the differential telescopic operational amplifier, the second feedback loop comprising:
   a second switch located between the second output of the differential telescopic operational amplifier and the second load input; and
   a second offset capacitor, a first plate of the second offset capacitor being coupled to the second switch between the second switch and the second load input, and a second plate of the second offset capacitor being coupled to ground; and
an input switching circuit for connecting an input common mode voltage to the first and second inputs of the differential telescopic operational amplifier.

12. The camera system of claim 11, wherein the first and second switches are controlled by an auto-zero signal.

13. The camera system of claim 12, wherein the input switching circuit is controlled by the auto-zero signal.

14. A differential telescopic operational amplifier comprising:
- a first load transistor for receiving a first load at a gate; and
- a second load transistor for receiving a second load at a gate;
- a third transistor having a source/drain region coupled to a source/drain region of the first load transistor and a second source/drain region coupled to a first amplifier output; and
- a fourth transistor having a first source/drain region coupled to a source/drain region of the second load transistor and a second source/drain region coupled to a second amplifier output, the third and fourth transistors each having gates coupled together and connected to a first bias line;
- a fifth transistor having a first source/drain region coupled to the second source/drain region of the third transistor and the first amplifier output; and
- a sixth transistor having a first source/drain region coupled to the second source/drain region of the fourth transistor and the second amplifier output, the fifth and sixth transistors each having gates coupled together and connected to a second bias line;
- a seventh transistor having a first source/drain coupled to a second source/having region of the fifth transistor, a gate coupled to a first signal input, and a second source/drain region coupled to a third bias line; and
- an eighth transistor having a first source/drain region coupled to a second source/drain region of the sixth transistor, a gate coupled to a second signal input, and a second source/drain region coupled to the third bias line.

15. The differential telescopic operational amplifier of claim 14, further comprising:
- a ninth transistor having a first source/drain region coupled to the second source/drain region of the seventh transistor and to the third bias line, and a gate coupled to a fourth bias line and to a first bias output; and
- a tenth transistor having a first source/drain region coupled to the second source/drain region of the eighth transistor and to the third bias line, and a gate coupled to a common mode feedback input.

16. A method of providing offset compensation for a differential telescopic operational amplifier, the method comprising:
- connecting first and second differential outputs of a differential telescopic operational amplifier to respective first and second gates of respective first and second load transistors;
- connecting first and second inputs of the operational amplifier to an input common mode voltage;
- forming respective offset voltage feedback loops between the first and second gates of the first and second load transistors and the first and second differential outputs; and
- sampling first and second differential offset voltages at the first and second differential outputs of the operational amplifier in respective first and second offset capacitors, a first plate of the first and second offset capacitors being respectively connected to the gates of the first and second load transistors, and a second plate of the first and second offset capacitors being respectively connected to ground.

17. The method of claim 16, wherein:
the sampling is performed during an auto-zero phase; and
the sampled voltages are held during a subsequent amplifying phase.

18. The method of claim 17, further comprising repeating the previous steps to provide dynamic offset cancellation.

19. The method of claim 18, wherein the auto-zero period at least partially overlaps with a row sampling period of an image sensor.

* * * * *